United States Patent
Kim et al.

(10) Patent No.: US 8,018,265 B1
(45) Date of Patent: Sep. 13, 2011

(54) DIFFERENTIAL SIGNAL GENERATION CIRCUIT

(75) Inventors: Yong Ju Kim, Ichon-shi (KR); Hae Rang Choi, Ichon-shi (KR); Ji Wang Lee, Ichon-shi (KR); Jae Min Jang, Ichon-shi (KR)

(73) Assignee: Hynix Semiconductor Inc., Ichon-si (KR)

( * ) Notice: Subject to any disclaimer, the term of this patent is extended or adjusted under 35 U.S.C. 154(b) by 0 days.

(21) Appl. No.: 12/840,255

(22) Filed: Jul. 20, 2010

(30) Foreign Application Priority Data

Apr. 30, 2010 (KR) .......................... 10-2010-0040550

(51) Int. Cl.
*H03K 5/13* (2006.01)
(52) U.S. Cl. ........................ 327/231; 327/233; 327/361
(58) Field of Classification Search .................. 327/231, 327/233–235, 355, 361, 407–408
See application file for complete search history.

(56) References Cited

U.S. PATENT DOCUMENTS

| | | | |
|---|---|---|---|
| 6,292,042 B1 | 9/2001 | Kim et al. | |
| 6,348,826 B1 * | 2/2002 | Mooney et al. | 327/270 |
| 6,420,920 B1 | 7/2002 | Huber et al. | |
| 6,727,741 B2 | 4/2004 | Huang et al. | |
| 6,815,994 B2 | 11/2004 | Huber et al. | |
| 7,161,397 B2 * | 1/2007 | Lee et al. | 327/149 |
| 7,181,180 B1 | 2/2007 | Teo et al. | |
| 7,466,179 B2 | 12/2008 | Huang et al. | |
| 7,532,050 B2 | 5/2009 | Haerle et al. | |
| 7,570,095 B2 | 8/2009 | Kim | |
| 7,688,124 B2 * | 3/2010 | Choi | 327/158 |
| 2009/0045862 A1 | 2/2009 | Kim et al. | |
| 2009/0163166 A1 | 6/2009 | Lin | |
| 2010/0098203 A1 | 4/2010 | Chien | |

FOREIGN PATENT DOCUMENTS

JP  2009-049994  3/2009

* cited by examiner

*Primary Examiner* — An T Luu
(74) *Attorney, Agent, or Firm* — Echelon Law Group, PC

(57) ABSTRACT

A differential signal generation circuit includes: an inverter array configured to sequentially invert an input signal to generate a plurality of delayed signals; and a phase mixer configured to mix a phase of a first delayed signal and a phase of a second delayed signal among the plurality of delayed signals at a preset mixing ratio to generate a first differential signal. The first delayed signal has a first delay from the input signal and the second delayed signal has a second delay from the input signal. The differential signal generation circuit is configured to generate a third delayed signal having a third delay from the input signal corresponding to a medium of the first and second delays, and the third delayed signal is further delayed to generate a second differential signal.

12 Claims, 5 Drawing Sheets

1

DIFFERENTIAL SIGNAL GENERATION CIRCUIT

CROSS-REFERENCES TO RELATED APPLICATION

The present application claims priority under 35 U.S.C. §119(a) to Korean Application No. 10-2010-0040550, filed on Apr. 30, 2010 in the Korean Intellectual Property Office, which is incorporated herein by reference in its entirety as if set forth in full.

BACKGROUND

1. Technical Field

The present invention relates to a semiconductor circuit, and more particularly, to a differential signal generation circuit.

2. Related Art

Semiconductor memories use a variety of signals such as data signals, clock signals, and control signals for their operation in various electronic circuits.

A variety of signal transmission methods may be used to allow the semiconductor memories to transmit such signals to/from other circuitries. A differential signaling method, which transmits two signals having opposite phases and receives signals by detecting a difference in the voltages of the two signals, is widely used as a method for accurately transmitting signals.

A semiconductor circuit using such a differential signaling method may include a circuit configuration for generating differential signals having opposite phases using a single-phase signal.

FIG. 1 is a circuit diagram of a conventional differential signal generation circuit which may be used in a semiconductor memory apparatus. Referring to FIG. 1, the conventional differential signal generation circuit 1 includes an inverter array.

The differential signal generation circuit 1 generates a first output signal OUT through a randomly selected inverter of the inverter array, and generates a second output signal OUTB having a phase opposite to that of the first output signal OUT through the immediately preceding inverter.

In a conventional differential signal generation circuit, however, since the number of inverters traversed by the first output signal OUT is different from the number of inverters traversed by the second output signal OUTB, a phase difference occurs due to a delay time difference and/or a process/voltage/temperature (PVT) variation, as shown in FIG. 2.

SUMMARY

Accordingly, various exemplary embodiments of the invention described herein may provide a differential signal generation circuit for generating differential signals with a reduced phase difference.

In one embodiment of the present invention, a differential signal generation circuit includes: an inverter array configured to sequentially invert an input signal to generate a plurality of delayed signals; and a phase mixer configured to mix a phase of a first delayed signal and a phase of a second delayed signal among the plurality of delayed signals at a preset mixing ratio to generate a first differential signal, the first delayed signal having a first delay from the input signal and the second delayed signal having a second delay from the input signal. The differential signal generation circuit is configured to generate a third delayed signal having a third delay from the input signal corresponding to a medium of the first and second delays, and the third delayed signal is further delayed to generate a second differential signal.

In another embodiment of the present invention, a differential signal generation circuit includes: an inverter array configured to sequentially invert an input signal to generate first through third delayed signals; a first phase mixer configured to mix the first and second delayed signals at a first mixing ratio to generate a first differential signal; a second phase mixer configured to mix the third delayed signal and the input signal at a second mixing ratio to generate a second differential signal.

In one embodiment of the present invention, a differential signal generation circuit includes: an inverter array configured to sequentially invert an input signal to generate first through third delayed signals; a first phase mixer configured to mix the first and second delayed signals at a first mixing ratio, which is set in response to a first mixing ratio setting signal, to generate a first differential signal; a second phase mixer configured to mix the third delayed signal and the input signal at a second mixing ratio, which is set in response to a second mixing ratio setting signal, to generate a second differential signal; and a mixing ratio setting unit configured to generate the first or second mixing ratio setting signal.

BRIEF DESCRIPTION OF THE DRAWINGS

Features, aspects, and embodiments are described in conjunction with the attached drawings, in which.

DETAILED DESCRIPTION

A differential signal generation circuit according to the present invention is described below in greater detail with reference to the accompanying drawings through preferred embodiments.

The differential signal generation circuit according to one embodiment is configured to receive an input signal IN and generate differential signals OUT and OUTB having a reduced or no phase difference through a phase interpolation method.

The differential signals OUT and OUTB may be denoted as a first differential signal OUT, and a second differential signal OUTB which has a phase opposite to that of the first differential signal OUT.

Figure 1:
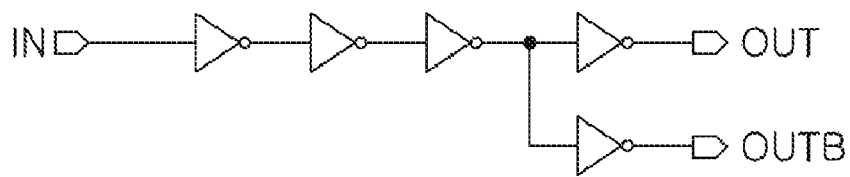
FIG. 1 is a circuit diagram of a conventional differential signal generation circuit.
Figure 2:
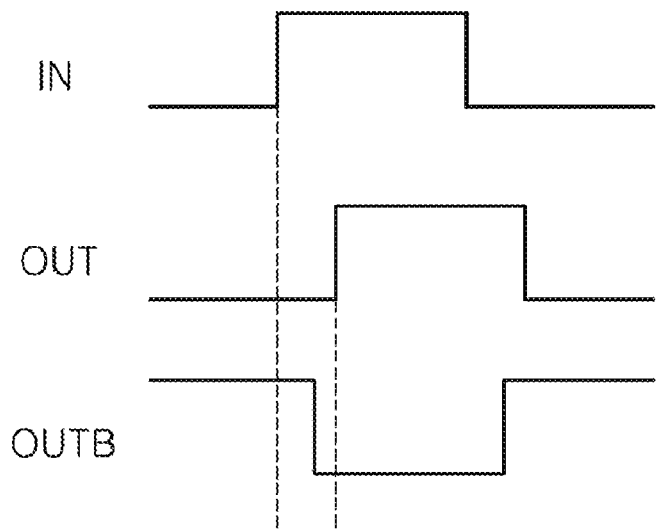
FIG. 2 is a timing diagram of differential signals outputted by the conventional differential signal generation circuit.
Figure 3:
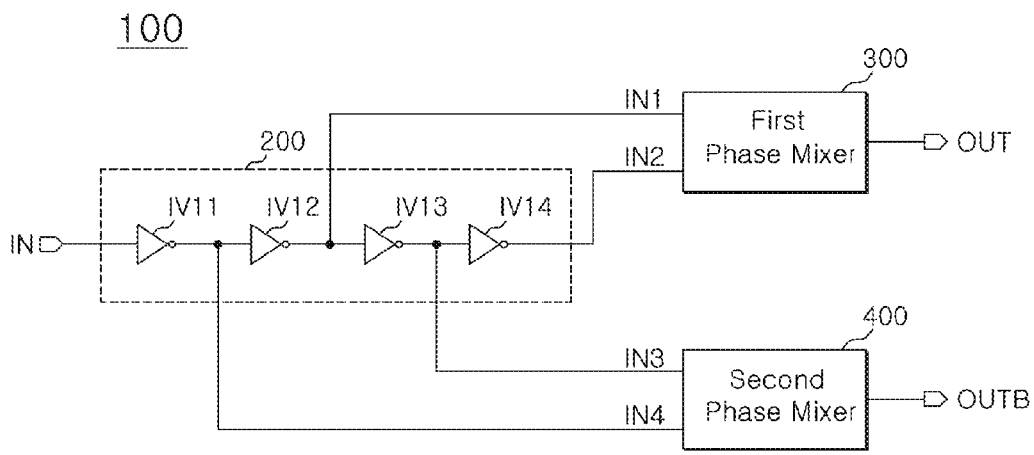
FIG. 3 is a block diagram of a differential signal generation circuit according to one embodiment.

FIG. 3 is a block diagram of a differential signal generation circuit according to one embodiment of the present invention. Referring to FIG. 3, the differential signal generation circuit according to the embodiment includes an inverter array 200, a first phase mixer 300, and a second phase mixer 400.

The inverter array 200 is configured to sequentially invert the input signal IN to generate first through fourth signals IN1-IN4.

The inverter array 200 includes a plurality of inverters. In the embodiment disclosed, for example, the inverter array 200 comprises first through fourth inverters IV11-IV14 which are coupled in series as shown in FIG. 3. The inverter array 200 is configured to sequentially invert an input signal to generate a plurality of delayed signals which will be described below.

The first inverter IV11 is configured to invert the input signal IN. The second inverter whose input is coupled to an output terminal of the first inverter IV11 is configured to invert the output signal of the first inverter IV12. The third inverter whose input is coupled to an output terminal of the second inverter IV12 is configured to invert the output signal of the second inverter IV12. Finally, the fourth inverter whose input is coupled to an output terminal of the third inverter IV3 is configured to invert the output signal of the third inverter IV3. Here, the first through fourth inverters IV11-IV14 may be designed to have a same delay time.

The output signal of the second inverter IV12 is referred to as a first delayed signal IN1. The output signal of the fourth inverter IV14 is referred to as a second delayed signal IN2. The output signal of the third inverter IV13 is referred to as a third delayed signal IN3. Finally, the output signal of the first inverter IV11 is referred to as a fourth delay signal IN4.

The first phase mixer 300 is configured to mix the first and second delayed signals IN1 and IN2 at a preset first mixing ratio (for example, 1:1) to generate a first differential signal OUT.

The second phase mixer 400 is configured to mix the third and fourth delayed signals IN3 and IN4 at a preset second mixing ratio (for example, 2:0) to generate a second differential signal OUTB.

Figure 4:
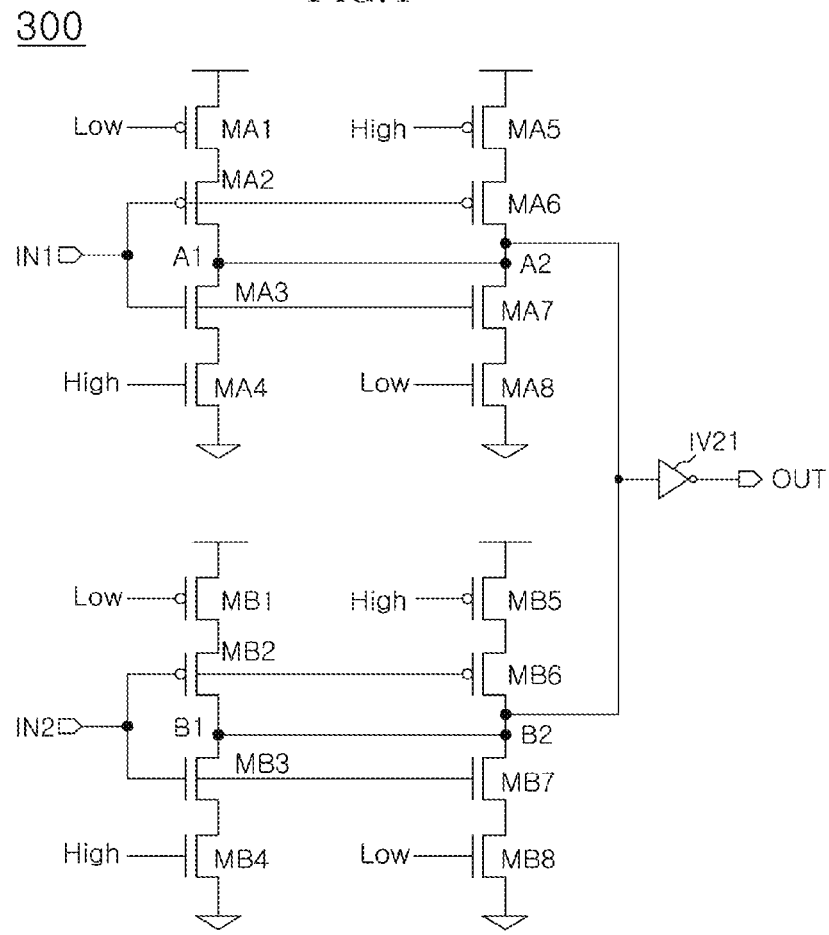
FIG. 4 is a circuit diagram of a first phase mixer of FIG. 3.

FIG. 4 is a circuit diagram of a first phase mixer shown in FIG. 3. Referring to FIG. 4, the first phase mixer 300 includes first, second, third, and fourth transistor arrays (MA1 through MA4, MA5 through MA8, MB1 through MB4, and MB5 through MB8, respectively) and an inverter IV21.

Each of the first, second, third, and fourth transistor arrays (MA1 through MA4, MA5 through MA8, MB1 through MB4, and MB5 through MB8, respectively) is coupled between a power supply terminal and a ground terminal. The transistors of each of the transistor arrays MA1-MA4; MA5-MA8; MB1-MB4; and MB5-MB8 are coupled in series between the power supply terminal and the ground terminal, respectively.

A node A1 of the first transistor array M1 through M4 and a node A2 of the second transistor array M5 through M8 are coupled to an input terminal of the inverter IV21.

The first delayed signal IN1 is inputted to the gates of the transistors MA2, MA3, MA6, and MA7.

A node B1 of the third transistor array MB1 through MB4 and a node B2 of the fourth transistor array MB5 through MB8 are also coupled to the input terminal of the inverter IV21.

The second delayed signal IN2 is inputted to the gates of the transistors MB2, MB3, MB6, and MB7.

The first transistor array MA1 through MA4 and the third transistor array MB1 through MB4 are activated in order to set the mixing ratio of the first delayed signal IN1 and the second delayed signal IN2 to 1:1, and the second transistor array MA5 through MA8 and the fourth transistor array MB5 through MB8 are deactivated.

To activate the first transistor array MA1 through MA4 and third transistor array MB1 through MB4, the gates of the transistors MA1, MA4, MB1, and MB4 are each set to "low", "high", "low", and "high," respectively.

To deactivate the second transistor array MA5 through MA8 and the fourth transistor array MB5 through MB8, the gates of the transistors MA5, MA8, MB5, and MB8 are each set to "high", "low", "high", and "low," respectively.

Figure 5:
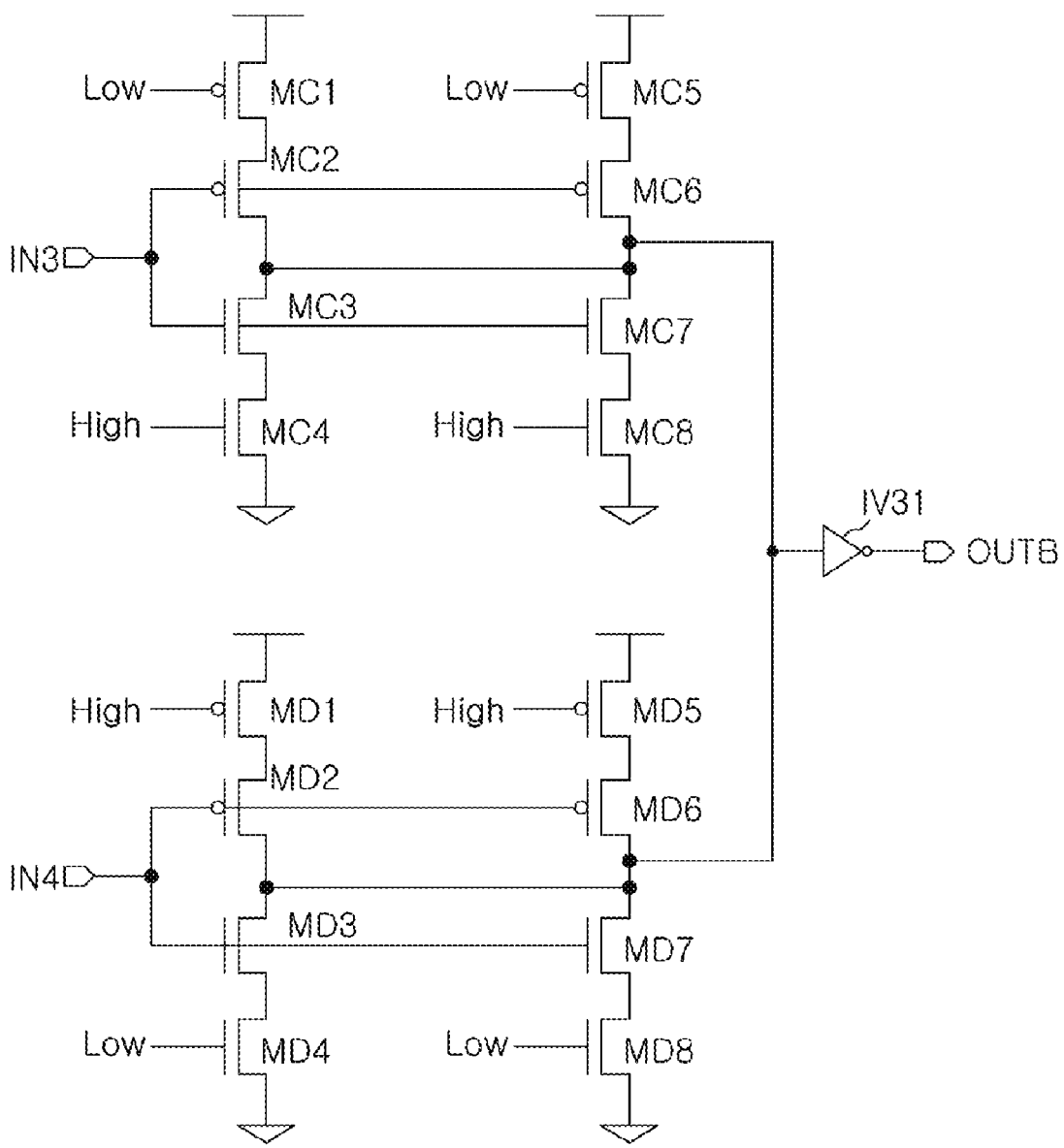
FIG. 5 is a circuit diagram of a second phase mixer of FIG. 3.

FIG. 5 is a circuit diagram of a second phase mixer of FIG. 3. Referring to FIG. 5, the second phase mixer 400 includes first, second, third, and fourth transistor arrays (MC1 through MC4, MC5 through MC8, MD1 through MD4, and MD5 through MD8, respectively) and an inverter IV31.

The second phase mixer 400 and the first phase mixer 300 have a similar circuit configuration, which will be described in more detail below.

The third delayed signal IN3 is inputted to the gates of the transistors MC2, MC3, MC6, and MC7, and the fourth delayed signal IN4 is inputted to the gates of the transistors MD2, MD3, MD6, and MD7.

To set a mixing ratio of the third delayed signal IN3 to the fourth delayed signal IN4 to 2:0, the first and second transistor arrays (MC1 through MC4 and MC5 through MC8) are activated, and the third and fourth transistor arrays (MD1 through MD4 and MD5 through MD8) are deactivated.

Here, the second phase mixer 400 mixes the third and fourth delayed signals IN3 and IN4 at the mixing ratio of 2:0. Therefore, since the third and fourth transistor arrays (MD1 through MD4 and MD5 through MD8) are maintained in a deactivated state, the circuit need not be configured.

However, when the third and fourth transistor arrays (MD1 through MD4 and MD5 through MD8) are not provided, a signal loading difference from the first phase mixer 300 may occur.

Therefore, the third and fourth transistor arrays (MD1 through MD4 and MD5 through MD8) of the second phase mixer 400 operate as a dummy circuit for compensating for the signal loading difference from the first phase mixer 300.

Figure 6:
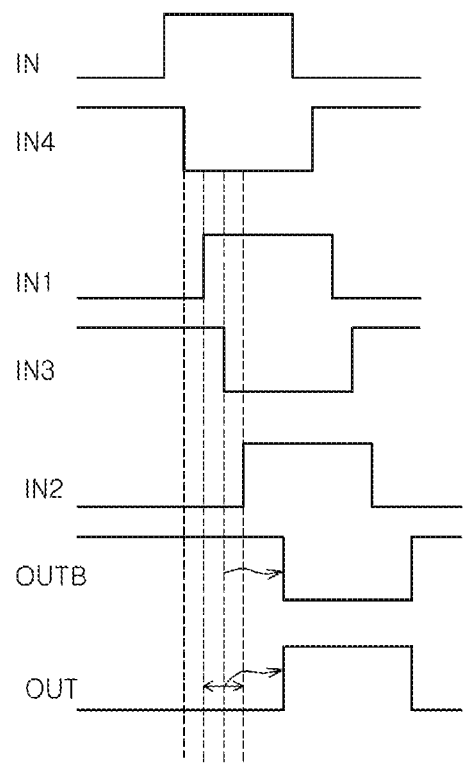
FIG. 6 is a timing diagram of differential signals outputted by the differential signal generation circuit according to the embodiment.

FIG. 6 is a timing diagram of differential signals outputted by the differential signal generation circuit according to the embodiment. Referring to FIG. 6, when the input signal IN passes through the first through fourth inverters (IV11 through IV14) of the inverter array 200, the first through fourth delayed signals (IN1 through IN4) are generated.

As described above, the first through fourth inverters (IV11 through IV14) are designed to have the same delay time. Therefore, assuming that the delay time of the third delayed signal IN4 is '1', the delay time of the first delayed signal IN1 may be '2', the delay time of the fourth delayed signal IN3 may be '3', and the delay time of the second delayed signal IN2 may be '4'. As can be seen from the drawing, the third delayed signal IN3 has a delay amount from the input signal which corresponds to a medium of the delay amount of the first delayed signal IN1 and the delay amount of the second delayed signal IN2.

Therefore, the first differential signal OUT generated by mixing the first and second delayed signal IN1 and IN2 at the mixing ratio of 1:1 has a delay time of '3', and the second differential signal OUTB generated by mixing the third and fourth delayed signals IN3 and IN4 at the ratio of 2:0 also has a delay time of '3'.

A PVT variation applies equally to the first through fourth inverters (IV11 through IV14).

Therefore, even with a PVT variation, the delay time of each of the first through fourth inverters increases or decreases by a same amount. Likewise, the delay times for signal processing by the first to and second phase mixers 300 and 400 increase or decrease by a same amount, even with a PVT variation.

As a result, the differential signal generation circuit according to this embodiment may generate the first and second differential signals OUT and OUTB having a reduced or no phase difference by using a single-phase input signal IN, regardless of the PVT variation.

In the above-described embodiment, the mixing ratio of each of the first and second phase mixers 300 and 400 is fixed. This is based on the assumption that the characteristics of all the inverters of the inverter array 200 are substantially the same and that the characteristics of the first and second phase mixers 300 and 400 are substantially the same.

However, if an unexpected characteristic difference exists, a phase difference may occur between the first and second differential signals OUT and OUTB. Another embodiment of the present invention is directed to a differential signal generation circuit which varies the mixing ratios of the phase mixers, which will be described in detail below.

Figure 7:
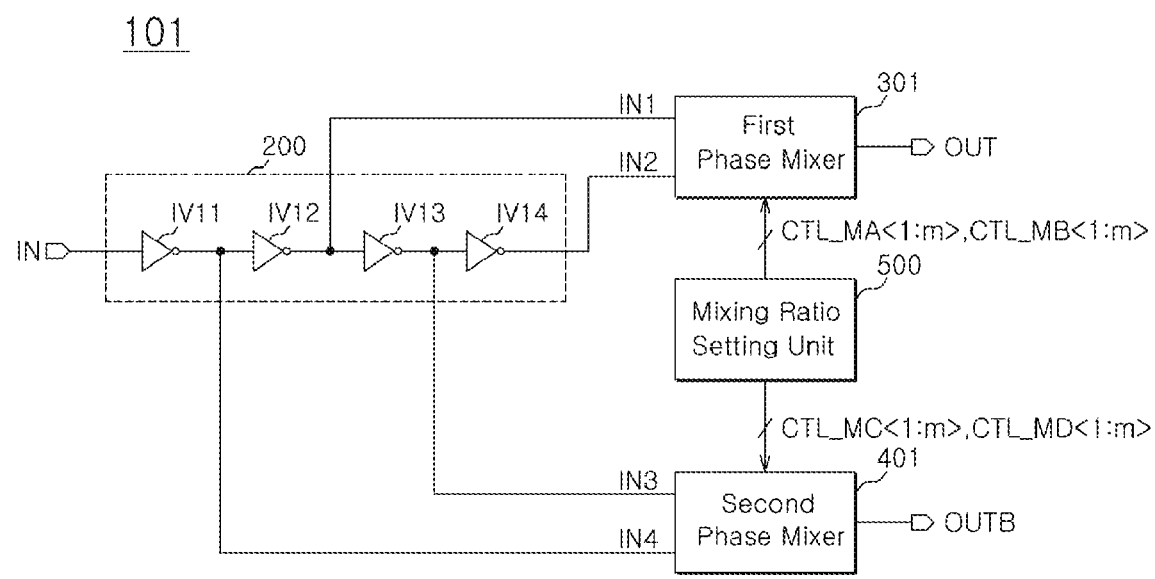
FIG. 7 is a block diagram of a differential signal generation circuit according to another embodiment.

FIG. 7 is a block diagram of a differential signal generation circuit according to another embodiment of the present invention. Referring to FIG. 7, a differential signal generation circuit 101 according to another embodiment includes an inverter array 200, a first phase mixer 301, a second phase mixer 401, and a mixing ratio setting unit 500.

The inverter array 200 includes a plurality of inverters, for example, first through fourth inverters IV11 through IV14. The inverter array 200 is configured to sequentially invert an input signal to generate a plurality of delayed signals which will be described below.

The first inverter IV11 is configured to invert the input signal IN. The second inverter whose input is coupled to an output terminal of the first inverter IV11 is configured to invert the output signal of the first inverter IV12. The third inverter whose input is coupled to an output terminal of the second inverter IV12 is configured to invert the output signal of the second inverter IV12. Finally, the fourth inverter whose input is coupled to an output terminal of the third inverter IV3 is configured to invert the output signal of the third inverter IV3. Here, the first through fourth inverters IV11 through IV14 may be designed to have a same delay time.

The output signal of the second inverter IV12 is referred to as a first delayed signal IN1. The output signal of the fourth inverter IV14 is referred to as a second delayed signal IN2. The output signal of the third inverter IV13 is referred to as a third delayed signal IN3. Finally, the output signal of the first inverter IV11 is referred to as a fourth delay signal IN4.

The first phase mixer 301 is configured to mix the first and second delayed signals IN1 and IN2 at a first mixing ratio, which is set in response to first mixing ratio setting signals CTL_MA<1:m> and CTL_MB<1:m>, to generate a first differential signal OUT.

The second phase mixer 401 is configured to mix the third and fourth delayed signals IN3 and IN4 at a second mixing ratio, which is set in response to second mixing ratio setting signals CTL_MC<1:m> and CTL_MD<1:m>, to generate a second differential signal OUTB.

The mixing ratio setting unit 500 is configured to generate the first mixing ratio setting signals CTL_MA<1:m> and CTL_MB<1:m> and the second mixing ratio setting signals CTL_MC<1:m> and CTL_MD<1:m> for setting the first and second mixing ratios to target values, respectively.

The mixing ratio setting unit 500 may be implemented as a fuse set comprising a plurality of fuses. When a plurality of fuses are used, desired internal fuses are selectively cut to vary the values of the first and second mixing ratio setting signals CTL_MA<1:m>, CTL_MB<1:m>, CTL_MC<1:m>, and CTL_MD<1:m>.

Figure 8:
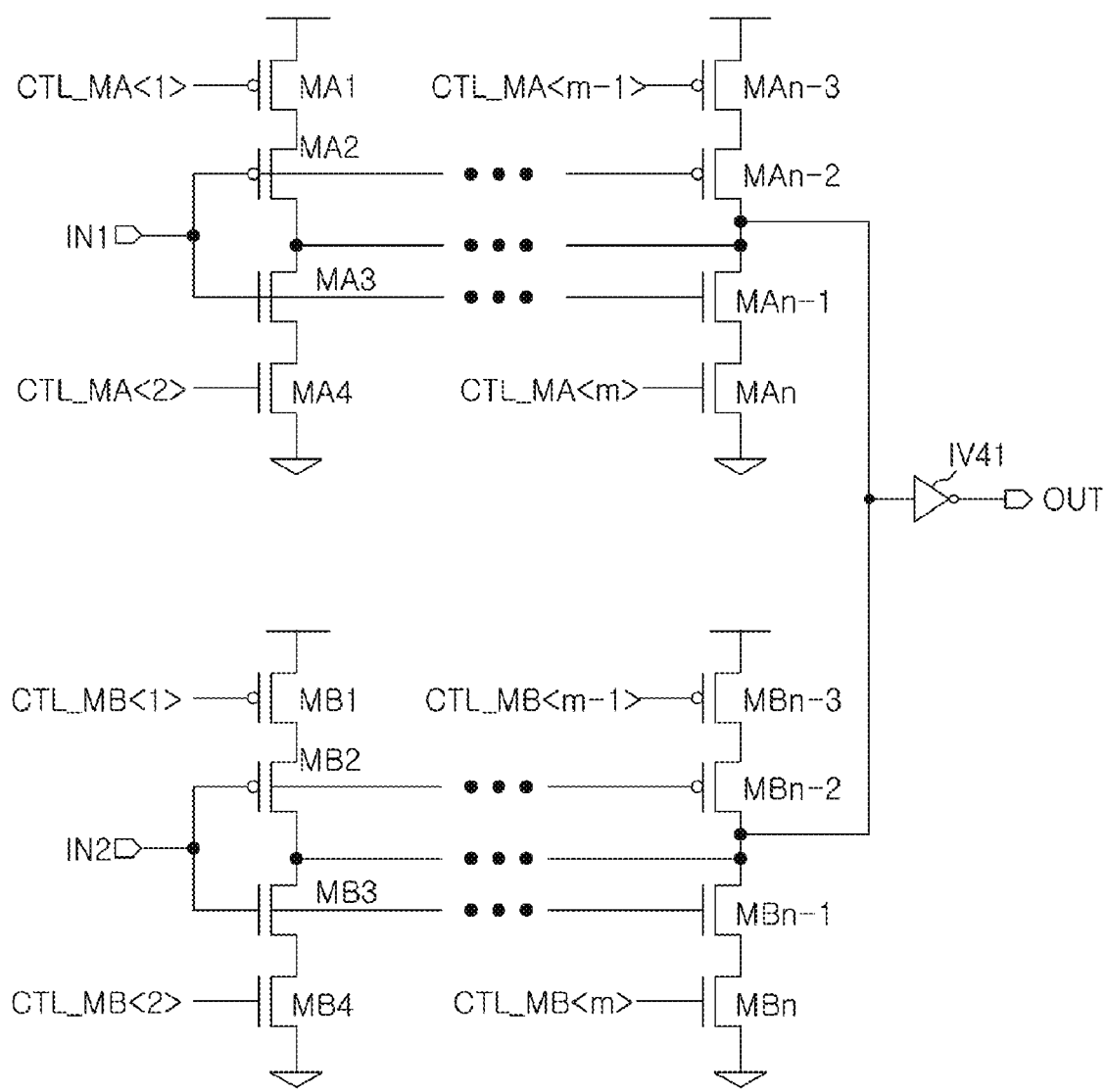
FIG. 8 is a circuit diagram of a first phase mixer of FIG. 7.

FIG. 8 is a circuit diagram of a first phase mixer of FIG. 7. Referring to FIG. 8, the first phase mixer 301 includes a plurality of transistors MA1 through MAn and MB1 through MBn and an inverter IV41.

The first phase mixer 301 is configured similarly to the first phase mixer 300 illustrated in FIG. 4. However, the first phase mixer 301 according to this embodiment has more transistor arrays receiving the first delayed signal IN1 and more transistor arrays receiving the second delayed signal IN2 than the first phase mixer 300.

The first mixing ratio setting signals CTL_MA<1:m> and CTL_MB<1:m> may be used to more accurately control the mixing ratio of the first phase mixer 301 in various ranges, compared with the first phase mixer 300 of FIG. 3.

In other words, in the first phase mixer 300 of FIG. 3, only certain mixing ratios such as 1:1 and 2:0 may be set. In the first phase mixer 301 of FIG. 8, however, various finely-controlled mixing ratios such as 1.1:1 and 1.2:1 may be set.

The second phase mixer 401 may be configured in a similar manner to the first phase mixer 301. However, the second mixing ratio setting signals CTL_MC<1:m> and CTL_MD<1:m> may be used to set a mixing ratio for the second phase mixer 401 that is different from that of the first phase mixer 301.

Basically, the mixing ratio of the first phase mixer 301 is set to 1:1, and the mixing ratio of the second phase mixer 401 is set to 2:1.

Therefore, when the characteristics of all the inverters of the inverter array 200 are substantially the same and the characteristics of the first and second phase mixers 301 and 401 are also substantially the same, the first and second differential signals OUT and OUTB have the same delay time, even with a PVT variation.

However, when a phase difference between the first and second differential signals OUT and OUTB occurs due to a difference in the characteristics of the inverter array 200, internal fuses of the mixing ratio setting unit 500 may be selectively cut to control the mixing ratio of the first phase mixer 301 or second phase mixer 401 and to consequently eliminate the phase difference between the first and second differential signals OUT and OUTB.

As described above, even if a phase difference between the first and second differential signals OUT and OUTB occurs due to an unexpected difference in some characteristic, the phase difference between the two signals may be eliminated by finely controlling the mixing ratio.

The differential signal generation circuit according to embodiments of the present invention may generate differential signals having a reduced or no phase difference, because an input signal always has a constant delay time regardless of a PVT variation.

While certain embodiments have been described above, those skilled in the art will understand that such embodiments are only examples. Accordingly, the differential signal generation circuit described herein should not be limited based on the described embodiments. Rather, the differential signal generation circuit described herein should only be limited in light of the claims that follow when taken in conjunction with the above description and accompanying drawings.

What is claimed is:

1. A differential signal generation circuit comprising:
an inverter array configured to sequentially invert an input signal to generate a plurality of delayed signals; and
a phase mixer configured to mix a phase of a first delayed signal and a phase of a second delayed signal among the plurality of delayed signals at a preset mixing ratio to generate a first differential signal, the first delayed signal having a first delay from the input signal and the second delayed signal having a second delay from the input signal;

wherein the differential signal generation circuit is configured to generate a third delayed signal having a third delay from the input signal corresponding to a medium of the first and second delays, and the third delayed signal is further delayed to generate a second differential signal.

2. The differential signal generation circuit according to claim 1, wherein the phase mixer is configured to mix the first and second delayed signals at a mixing ratio of 1:1 to generate the first differential signal.

3. The differential signal generation circuit according to claim 1, wherein the inverter array comprises:
   a first inverter configured to receive the input signal and to output the first delayed signal;
   a second inverter configured to receive the first delayed signal and to output the third delayed signal; and
   a third inverter configured to receive the third delayed signal and to output the second delayed signal.

4. A differential signal generation circuit comprising:
   an inverter array configured to sequentially invert an input signal to generate first through third delayed signals;
   a first phase mixer configured to mix the first and second delayed signals at a first mixing ratio to generate a first differential signal; and
   a second phase mixer configured to mix the third delayed signal and the input signal at a second mixing ratio to generate a second differential signal.

5. The differential signal generation circuit according to claim 4, wherein a delay time of the third delay signal has a value between a delay time of the first delayed signal and a delay time of the second delayed signal.

6. The differential signal generation circuit according to claim 4, wherein the first mixing ratio is 1:1.

7. The differential signal generation circuit according to claim 4, wherein the second mixing ratio is 2:0.

8. The differential signal generation circuit according to claim 4, wherein the inverter array comprises:
   a first inverter configured to receive the input signal and to output the first delayed signal;
   a second inverter configured to receive the first delayed signal and to output the third delayed signal; and
   a third inverter configured to receive the third delayed signal and to output the second delayed signal.

9. A differential signal generation circuit comprising:
   an inverter array configured to sequentially invert an input signal to generate first through third delayed signals;
   a first phase mixer configured to mix the first and second delayed signals at a first mixing ratio, which is set in response to a first mixing ratio setting signal, to generate a first differential signal;
   a second phase mixer configured to mix the third delayed signal and the input signal at a second mixing ratio, which is set in response to a second mixing ratio setting signal, to generate a second differential signal; and
   a mixing ratio setting unit configured to generate the first or second mixing ratio setting signal.

10. The differential signal generation circuit according to claim 9, wherein a delay time of the third delayed signal has a value between a delay time of the first delayed signal and a delay time of the second delayed signal.

11. The differential signal generation circuit according to claim 9, wherein the inverter array comprises:
    a first inverter configured to receive the input signal and to output the first delayed signal;
    a second inverter configured to receive the first delayed signal and to output the third delayed signal; and
    a third inverter configured to receive the third delayed signal and to output the second delayed signal.

12. The differential signal generation circuit according to claim 9, wherein the mixing ratio setting unit is configured to vary the first or second mixing ratio setting signal by selectively cutting an internal fuse.

* * * * *